United States Patent [19]

Sawyer et al.

[11] Patent Number: 4,726,036
[45] Date of Patent: Feb. 16, 1988

[54] DIGITAL ADAPTIVE FILTER FOR A HIGH THROUGHPUT DIGITAL ADAPTIVE PROCESSOR

[75] Inventors: Laurence D. Sawyer, Reading, Vt.; Patrick J. Smith, Salt Lake City, Utah

[73] Assignee: Unisys Corporation, Blue Bell, Pa.

[21] Appl. No.: 30,302

[22] Filed: Mar. 26, 1987

[51] Int. Cl.⁴ .............................................. H04B 3/14
[52] U.S. Cl. ......................................... 375/14; 333/18
[58] Field of Search ............... 375/11, 12, 14; 333/18, 333/28; 364/724, 825; 379/394, 398; 328/162, 167

[56] References Cited

U.S. PATENT DOCUMENTS

| 4,146,840 | 3/1979 | McRae et al. | 333/18 |
| 4,290,139 | 9/1981 | Walsh | 375/14 |
| 4,347,615 | 8/1982 | Ash | 375/14 |
| 4,438,521 | 3/1984 | Mattei | 333/18 |

Primary Examiner—Benedict V. Safourek
Attorney, Agent, or Firm—Glenn W. Bowen; Laurence J. Marhoefer

[57] ABSTRACT

The weights of least mean square (LMS) adaptive filter are updated with a different set of taps than are used to form the output of the adaptive filter in the adaptive processing device of the present invention. As a result of performing the multiplications and sums required for the filter operation simultaneously, an integral number of clock cycle delays appear in the narrowband and error feedback channels. The number of taps of the tapped delay line of the invention are increased, whereby the increased delay through the delay line may be used to compensate for a delay through the filter of an integral number of clock delay cycles. Instantaneous weight updating in accordance with the signal being utilized, may then be achieved at a clock rate frequency that is ten times or more greater than prior art adaptive filters.

1 Claim, 2 Drawing Figures

DIGITAL ADAPTIVE FILTER FOR A HIGH THROUGHPUT DIGITAL ADAPTIVE PROCESSOR

BACKGROUND OF THE INVENTION

Least mean square (LMS) adaptive signal processing employ adaptive filters which require instantaneous weight updating. For digital processors this means that the input signal is sampled, the adaptive filter output is calculated and subtracted from the input sample, and the resulting error is used to update the weights during a single clock cycle. This procedure requires that several sets of operations be performed sequentially, which limits the sampling rate and hence the throughput of the processor. The present invention provides a digital adaptive filter that allows for the throughput of a digital adaptive processor to be substantially increased, for example, by a factor of ten or more.

BRIEF DESCRIPTION OF THE DRAWINGS

The present invention is described by reference to the drawings in which.

TECHNICAL DESCRIPTION OF THE INVENTION

Figure 1:
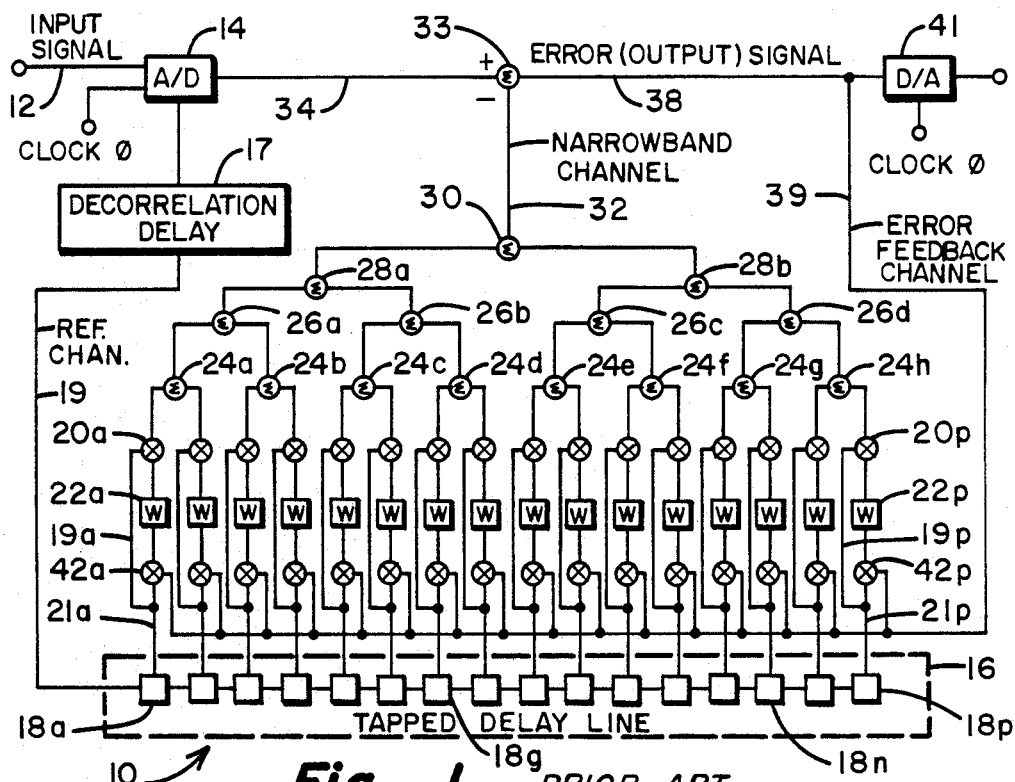
FIG. 1 represents a prior art adaptive filter.

An example of a prior art digital adaptive filter 10 is shown in FIG. 1 in which 16 weight accumulators 22a-22p are utilized. During operation of this device the input signal on the line 12 is sampled by the analog-to-digital converter 14 and is passed on the line 15 through the decorrelation delay device 17 to the line 19. The signal on line 19 is termed the "reference channel signal". The reference channel signal is then shifted down the tapped delay line 16 through the 16 taps 18a-18p. Signals on the taps are passed on the lines 19a-19p through a series of multipliers, 20a-20p, where the tap values are multiplied by the then current weight values stored in the accumulators 22a-22p.

The output products of the multipliers are next summed in a four step summer consisting of the summers 24a-24h, 26a-26d, 28a-28b and 30 to provide a narrowband channel signal on the line 32. The summed narrowband channel signal on the line 32 is subtracted from the digitized input signal on the line 34 by the subtractor 33. The signal on the line 38 is a digital error signal which is supplied on the line 39 as the error feedback channel signal to the multipliers 42a-42p, along with the taps values 18a-18p, to update the weight values of the accumulators 22a-22p via the lines 21a-21p, and it is also supplied to the digital-to-analog converter 41 to provide an output signal.

While the described prior art circuit of FIG. 1 operates satisfactorily at low clock rates, if the clock that controls the analog-to-digital converter 14 and the digital-to-analog converter 41 is increased in frequency, there will not be sufficient time in one clock cycle to perform all of the sequential operations described above. The circuit shown in FIG. 2, which represents the present invention, specifies that the above operations be performed simultaneously as opposed to sequentially. Hence, the amount of time allowed for each operation may increase by a factor of 10 or more. In the example given above, a sequence of seven operations must be performed in a single clock cycle. But in the current invention, these operations are performed simultaneously, thus allotting a full clock cycle to each operation. Then because each operation has seven times, the allotment of time in which to be executed, the clock frequency, and hence the throughput, can be increased by a factor of seven. However, by performing these operations simultaneously, an integral number of clock cycles of delay appear in the narrowband channel and the error feedback channel, which violates the instantaneous update criterion of the LMS algorithm. The present invention incorporates a method for compensating for these time delays.

Figure 2:
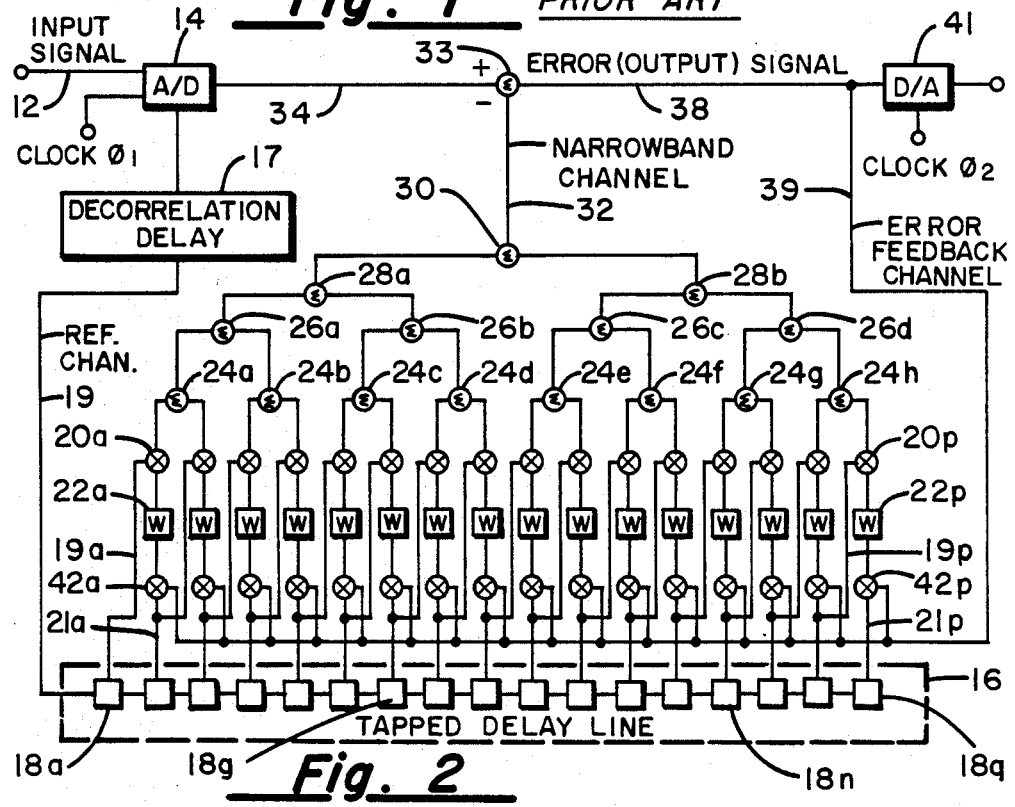
FIG. 2 represents an adaptive filter constructed in accordance with the present invention.

In the embodiment of FIG. 2 integral number of clock delay cycles which may occur are compensated for as the clock frequency increases by the addition of one tap for each clock delay cycle. For example, as shown in the circuit of FIG. 2, there are 17 taps, (18a-18q) on the delay line 16, for a 16 bit adaptive filter in which a single clock delay cycle occurs. The first tap 18A is connected to the left-most multiplier 20a which also receives a signal representative of the weight value stored in the left-most accumulator 22a. In a corresponding manner, each of the taps 18b-18p are connected to the corresponding one of the multipliers 20b-20p which respectively receive the stored weight values from the one of the accumulators 22b-22p. The digital error feedback channel signal is supplied to the multipliers 42a-42p, along with the taps values 18b-18q, in order to update the weight accumulator values. The important difference from the prior art circuit, is that the taps, values used to update the weight accumulator values are shifted by 1 tap with respect to the taps used to generate the narrowband output taps.

While only a single tap is shown as being added in the drawings for a single delay cycle, for simplicity of illustration, it is apparent that an integral number of clock delays through the narrowband channel and error feedback channel may be compensated for in a similar manner by adding additional taps as required due to the length of the delay. The multipliers 20a-20p are employed to form the narrowband channel signal, in conjunction with the taps 18a-18p, by coupling tap 18a to multiplier 20a, tap 18b to multiplier 20b, etc. through tap 18p which is coupled to multiplier 20p. Weight updating is accomplished by supplying the error feedback channel signal to the multipliers 42a-42p, which are also supplied with the taps values which are displaced from the values 18a-18p by the number of taps needed to compensate for the delay through the circuit.

For example, in the illustrated embodiment, the multiplier 42a is connected to the tap 18b since there is only one additional delay tap provided on the delay line. If three clock cycle delay times were required, then three additional taps would have to be provided on the left-hand end of the delay line. The first of these taps would be connected to the multiplier 20a, the second would be connected to the multiplier 20b and the third would be connected to the multiplier 20c. However, in this case the first tap that would be connected to the multiplier 42a, would then be the fourth tap from the left of the delay line, and the fifth tap from the left-hand of the delay line would be connected to the multiplier 42b. In this manner, a three clock cycle delay would be provided between the time that the multiplier 20a multiplied the signal on tap 18a with the weight from the accumulator 22a until the time that the error feedback channel signal was applied to the multiplier 42a. The error feedback channel signal in conjunction with the signal which was then concurrently present on the fourth tap from the left-hand side of the delay line would then be used to update the stored weight value in the accumulator 22a.

The timing of the device is such that the occurrence of the reference channel signal in the left-most tap provides a predicted value that uses the weight value then stored in the accumulator 22a to provide an error signal in the error feedback channel. When the same reference channel signal reaches a particular tap along the delay line at the same instant that the error feedback signal reaches the one of the multipliers 42a–42p that is associated with the delayed tap, the weight accumulator to which it is coupled will be updated so as to achieve the desired synchronization.

While a particular embodiment has been disclosed, it is intended that this patent be inclusive of all embodiments of the invention that are encompassed within its scope.

We claim:

1. In a digital adaptive line enhancer comprising,
an input signal means for receiving an analog input signal,
analog-to-digital input converter means for receiving said input signal and for providing a first digital signal,
decorrelation delay means for receiving a sample of said input signal and providing a delayed reference signal therefrom,
signal delay means comprising a plurality of delay tap means for providing tapped delays of said reference signal from said decorrelation means,
a plurality of weight accumulator means each having its input coupled to one of said signal multiplying means, and equal in number thereto, for supplying a separate weight value signal on each of their outputs,
a first plurality of signal multiplying means for multiplying said tapped delay signal from one of said delay tap means by one of said weight value signals,
summing means coupled to the outputs of said first plurality of signal multiplying means for providing a narrowband channel digital signal representative of the outputs of said multiplying means,
subtracting means for subtracting said narrowband channel digital signal from said first digital signal and for supplying an error output signal representative of the difference thereof,
error feedback channel means for supplying a sample of said error signal,
a second plurality of signal multiplying means equal in number to said first plurality of signal multiplying means, wherein each of said plurality of signal multiplying means is coupled to receive said error feedback channel signal and each is coupled to one of said delay tap means of said signal delay means, and
clock means coupled to control the clocking of said analog-to-digital input converter means, which is operated at a clock frequency which results in a signal delay through said narrowband channel and said error feedback channel that is equal to the period of an integral number of clock cycles,
the improvement comprising additional delay tap means provided on said signal delay means so that there are more delay tap means on said delay means than there are said weight accumulator means by an amount which is equal to the total number of clock cycles of delay through the narrowband channel and the error feedback channel,
wherein said delay tap means are interconnected with said first and second multiplying means so that the signal which is at any given delay tap means at a particular time is coupled to a given one of said first multiplying means along with a given weight accumulator means at this particular time to form a component of an initial narrowband channel signal which will be at a subsequent tap delay means after a delay time that is substantially equal to said total signal, wherein said subsequent delay tap means is connected to the one of said second multiplying means which is utilized to update the same weight accumulator means that was used to produce said component of said initial narrowband channel signal.

* * * * *